United States Patent [19]

Parks

[11] 4,095,867
[45] Jun. 20, 1978

[54] COMPONENT CONNECTION SYSTEM
[75] Inventor: Howard L. Parks, Woodland Hills, Calif.
[73] Assignee: Bunker Ramo Corporation, Oak Brook, Ill.
[21] Appl. No.: 513,649
[22] Filed: Oct. 10, 1974
[51] Int. Cl.² ............................................ H01R 13/28
[52] U.S. Cl. ................................................. 339/92 M
[58] Field of Search .............. 339/17, 75, 92; 29/626, 29/627

[56] References Cited

U.S. PATENT DOCUMENTS

| 2,853,656 | 9/1958 | Dowds | 339/17 N |
| 3,705,332 | 12/1972 | Parks | 29/626 |

OTHER PUBLICATIONS

IBM Technical Bulletin, Beverly et al., Multilayer Electronic Package, 1966-03, pp. 1325 & 1326, vol. 8, No. 10.

Primary Examiner—Joseph H. McGlynn
Attorney, Agent, or Firm—F. M. Arbuckle; A. Freilich

[57] ABSTRACT

The following specification illustrates a stack including one or more interconnect wafer screens and a connector wafer screen having active circuit components detachably secured thereto by means of a component wafer interconnected with the stack through a connector wafer screen and against which pressure is applied by a coupon pressure cap on tightening a bolt extending through the stack. A dual inline package is also shown detachably secured to a printed circuit board by means of a wafer against which pressure is applied to effect connections between the printed circuit board conductive segments and the package terminals.

4 Claims, 15 Drawing Figures

COMPONENT CONNECTION SYSTEM

FIELD OF THE INVENTION

This invention relates in general to packaging structures which typically comprise one or more batch fabricated electrically conductive plates or wafers stacked together to form a parallelepiped structure containing one or more active components (e.g., integrated circuit chips) as well as conductor means providing coaxial interconnections in X-, Y-, and Z- axis directions, and more particularly, an arrangement in which active circuit components on a wafer which provides coaxial interconnection are detachably secured to other planar circuit elements.

SUMMARY OF THE PRIOR ART

Some electrical circuit packaging structures include a stack of wafers having co-axial interconnective characteristics, each formed of a generally planar metallic member with each member carrying a matrix of conductive islands or slugs electrically insulated from the respective metallic member and are typically illustrated in U.S. Pat. No. 3,775,844 and 3,769,702 or 3,705,332, for example.

The definitions of certain terms, as appeared in my U.S. Pat. No. 3,705,332, are set forth for clarity:

COMPONENT WAFERS

Component wafers physically support and provide electrical connections for components such as active circuit devices. They usually provide Z-axis slugs for connection between wafers, and they serve to complete the coaxial shielding of the X- and Y- conductors. Each component wafer provides means for connecting the terminals of the active devices to the Z- axis slugs.

For example, as set forth in U.S. Pat. No. 3,705,332, FIGS. 3 and 4 thereof illustrate a portion of a component wafer 12 showing an active device chip 40 mounted thereon and connected thereto. The component wafer 12 has a plurality of Z-axis slugs 42 formed within the profile thereof, each slug 42 constituting an island isolated from the remainder of the wafer by dielectrical material 44 disposed within an opening formed in the wafer extending between, and exposed at, the top surface 46 and the bottom surface 48 thereof. That is, each slug 42 shown in FIGS. 3 and 4 can be considered as being supported within an opening extending through the wafer by dielectric material 44 which both supports and electrically isolates the slug from the remaining wafer material 50. The slugs 42 shown in FIGS. 3 and 4 are preferably arranged in a uniform rectangular matrix, for example, on 50 mil centers in both the X- and Y- axis directions.

CONNECTOR SCREEN WAFERS

Connector screen wafers provide a matrix of Z-axis slugs forming throughconnections for providing wafer to wafer interconnections.

For example, as set forth in my U.S. Pat. No. 3,705,332, attention is directed to FIGS. 7 and 8 thereof which illustrate a connector wafer 16 which is formed to include a plurality of Z-axis slugs 86 preferably arranged in a uniform rectangular matrix. Each Z-axis slug 86 is completely surrounded by dielectric material 88 supporting the slug and electrically insulating it from the remainder of the wafer material 90. Each Z-axis slug 86 is exposed on the top and bottom wafer surfaces 92 and 94. Malleable contacts 96 are preferably mounted on both ends of each of the slugs 86, i.e. at both the top surface 92 and the bottom surface 94. As will be seen hereinafter, alternate layers in the stack comprise connector wafers in order to provide Z-axis interconnections to wafers above and below which can constitute either interconnection or component wafers. The malleable contacts 96 are formed of more ductile material than the Z-axis copper slugs and so when the stack is placed under pressure within the housing 20 of FIG. 2, the contacts 96 are deformed by engagement with the aligned Z-axis slugs in adjacent wafers to thus form good interconnections between the wafers.

FILLER WAFERS

Filler wafers are normally wafers which are used to fill up space in a stack due to the height of an active device therein. Typically, they provide electrical connections in the "thickness" directions.

For example, as set forth in FIG. 9 of the U.S. Pat. No. 3,705,332, a plurality of filler wafers 106 are stacked above the connector wafer 102 to equal the height of the active device 40. The filler wafers 106 are substantially identical to the connector wafers 102 in that they define a matrix organization of Z-axis slugs. A plurality of filler wafers can be fused together to perform a composite wafer or alternatively, the filler wafers can be interconnected as a consequence of the Z-axis pressure provided by housing 20. In the latter case, the filler wafers 106 are selected so that only alternate layers contain malleable contacts in order to assure that Z-axis interconnections from one wafer to another are always formed between a malleable contact and the opposed face of an aligned Z-axis slug.

INTERCONNECTION WAFERS

Interconnection wafers are fabricated so as to include Z-axis slugs as well as X-Y conductors extending in the plane of the wafer, thus providing for X-, Y- and Z- interconnections.

For example, reference is made to FIG. 5 of the U.S. Pat. No. 3,705,322, which illustrates a fragmentary portion of an interconnection wafer 14 which functions to define X-Y as well as Z-axis interconnections. The interconnections are formed in the wafer 14 similarly to the interconnections formed in the wafer 12. Thus, a typical wafer 14 defines a plurality of Z-axis slugs 70 extending between the top surface 72 and the bottom surface 74 of the wafer 14. The Z-axis slug 70 is interconnected with another Z-axis slug 76, for example, by a recessed Z-Y conductor 78. As was described in conjunction with FIGS. 3 and 4, both the X-Y conductors and Z-axis slugs are surrounded by dielectric material which provides electrical insulation to the remaining wafer material 82.

OUTPUT CONNECTOR WAFER

An output connector wafer is a wafer used for making connections to and from the stack to external circuitry.

For example as stated at col. 4, lines 15-20 of the U.S. Pat. No. 3,705,332, the connector block 24 contains insulated through-conductor output terminal pins 24a electrically coupled to the stack 10 by an output connector wafer 16a so to thereby permit convenient electrical connection of the stack and housing to external electrical circuitry.

Referring again, in general, to the summary of the prior art, fabricated electrically conductive wafers which have certain coaxial characteristics can include interconnection wafers in which conductive islands extending to one or both opposite surfaces of the wafer are selectively interconnected in the X and/or Y direction. Connector screens are provided between the interconnect wafers and each connector screen includes a matrix of slugs insulated from the respective metallic members with each slug having malleable bumps or projections at opposite ends for engaging the coplanar surfaces of the respective islands of the interconnect wafers under pressure for extending connections in the Z direction or through the stack.

Active circuit components such as integrated circuits or the like are generally located in a package having terminals and for use in a component connection assembly. The terminals are connected to conductive islands in a component wafer. The conductive islands of the component wafers extend in an X and/or Y direction so as to be aligned with the slugs of a connector screen wafer outside of the periphery of the package from which connections are extended through the stack when the component wafer and package are located in the stack. One or more filler wafers having openings therein to accommodate the package are also incorporated in the stack to compensate for the volume of the package in the stack.

With the described arrangement, the removal or replacement of one of the active components is difficult while the size and complexity of the component wafer and the provision of fillers wafers create additional problems.

SUMMARY OF THE INVENTION

To overcome the aforementioned problems, the present invention proposes a wafer which provides coaxial interconnections that carries an active circuit component and a pressure cap for detachably securing or attaching the wafer to a stack of wafers having co-axial interconnective characteristics or to a printed circuit card under pressure for insuring the completion of the proper electrical connections.

Thus, a pair of flat packs, for example, located on a component wafer having only a slightly larger area than the flat packs may be connected to respective connections in a stack through a connector wafer screen of similar area when a pressure cap is bolted to the stack to exert pressure on the component wafer and the malleable projections on the connector screen for ensuring the completion of the electrical connections from the active circuit component to the stack. Since only a minimum area of the stack is needed for each flat pack, a large number of active circuit components may be secured to the stack without the use of filler wafers and each may be easily removed for replacement, repair or test purposes.

The same principle, of course, is applied when connecting active circuit components such as dual in-line packages, commonly knows as DIPs or the like, to a printed circuit board since the malleable projections engage the planar conductive islands of the board under pressure to insure good electrical connections and the package may thereafter be removed or replaced easily and without the necessity of unsoldering and resoldering the parts.

The stack is also provided with sturdy frame members for locating and securing the wafers of the stack under pressure and this, in conjunction with the large available area, facilitates the use of a large connector adjacent to one edge of the stack for extending external electrical connections to and from the stack.

It is therefore a primary object of this invention to provide means for detachably securing a component wafer having coaxial characteristics in a circuit and/or to provide an improved wafer stack.

Other objects and features of the present invention will become apparent upon examination of the following specification and claims together with the accompanying drawings.

BRIEF DESCRIPTION OF THE DRAWINGS

FIG. 2 is an exploded isometric view of the assembly shown in FIGS. 1 and 1a.

DESCRIPTION OF THE INVENTION

Figure 1:
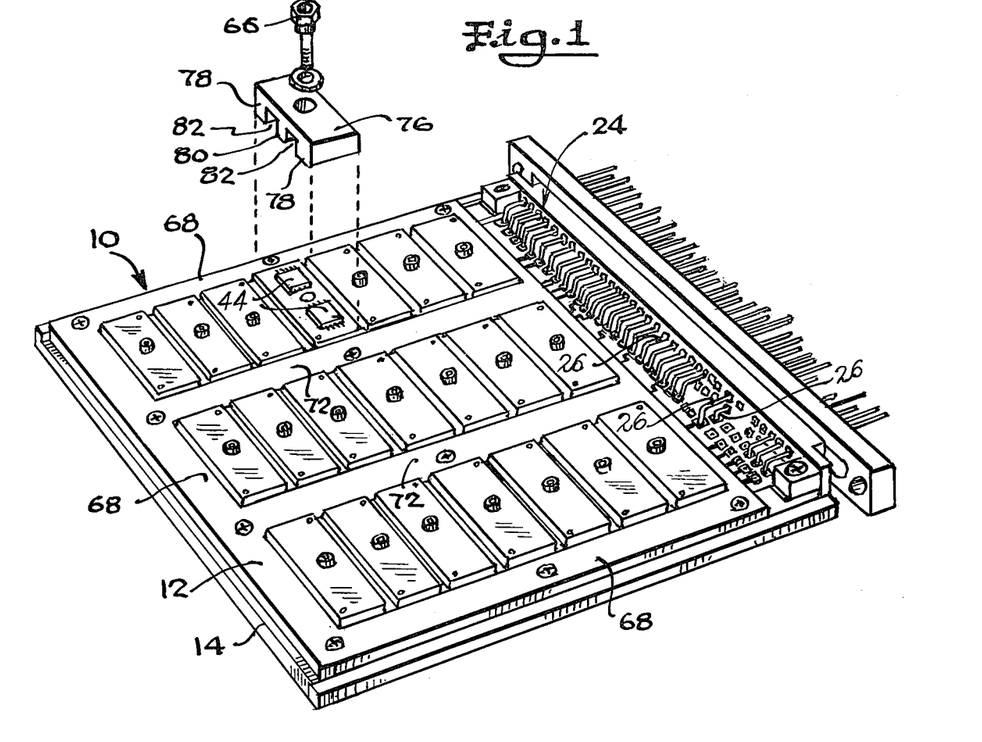
FIG. 1 is a front isometric view of a packaging assembly employing the principles of the present invention.
Figure 1A:
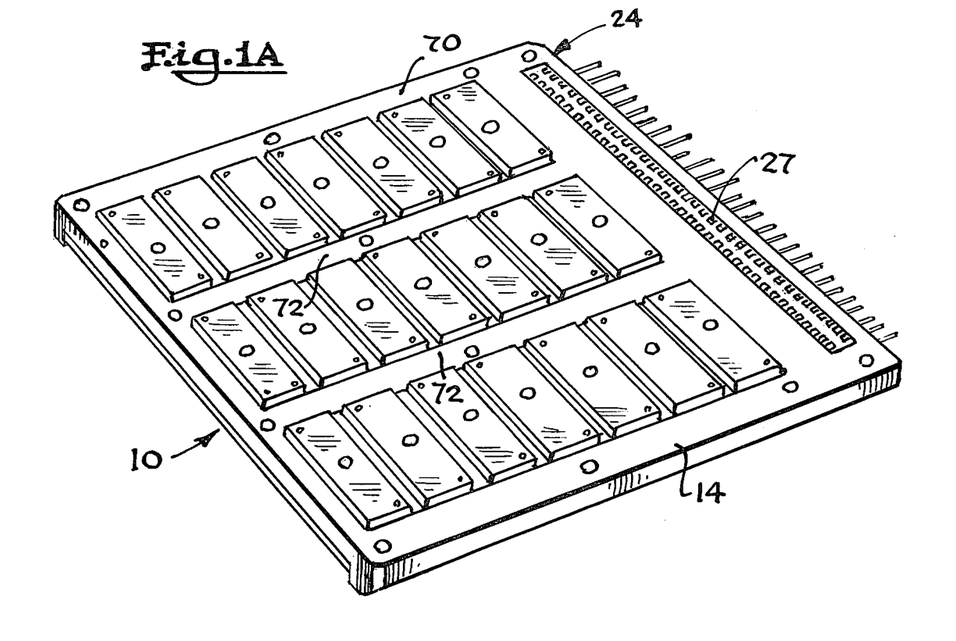
FIG. 1a is a rear isometric view of the assembly shown in FIG. 1.
Figure 2:
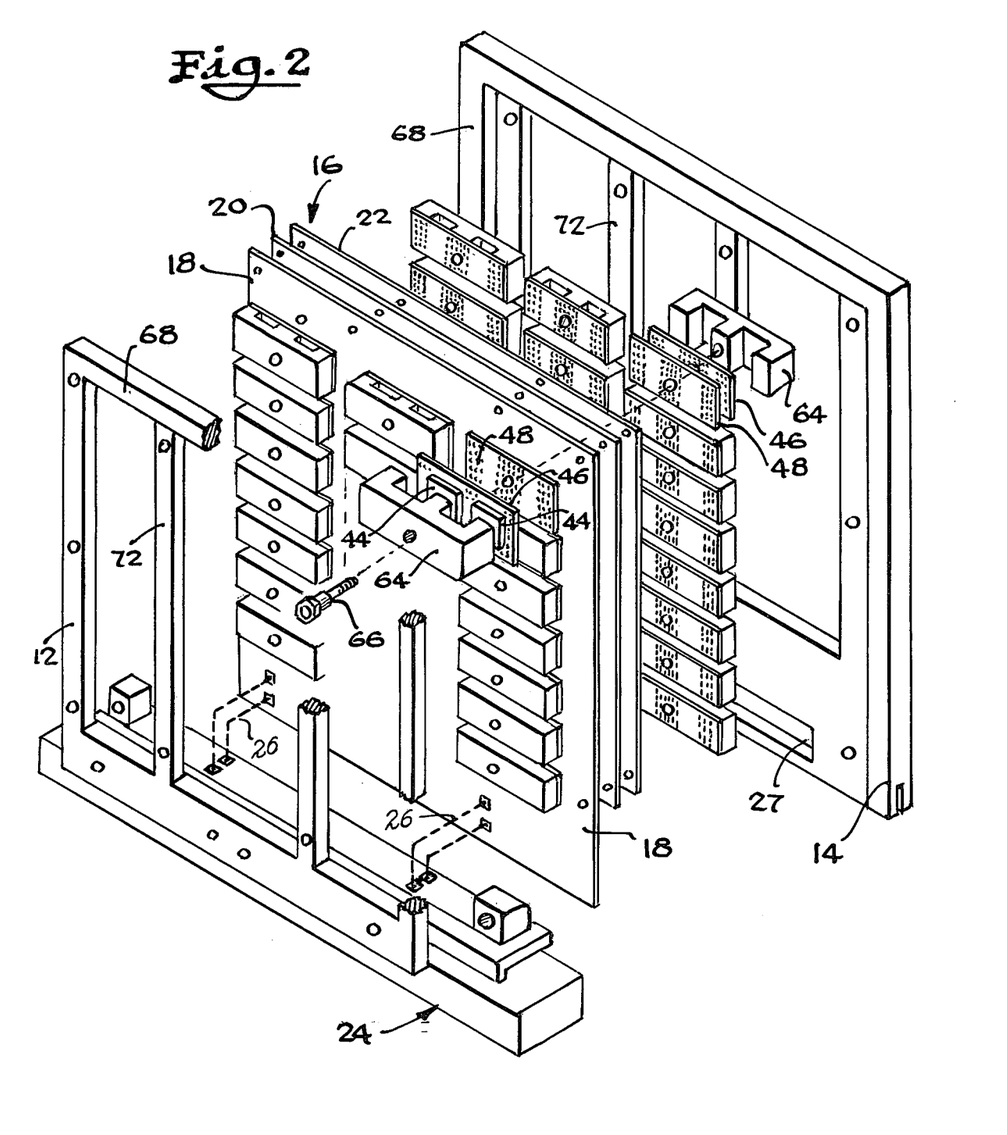

In FIGS. 1, 1a and 2 of the drawings, a packaging assembly or circuit module for use as a divide by $n$ counter for example, is indicated by the reference character 10.

Figure 3:
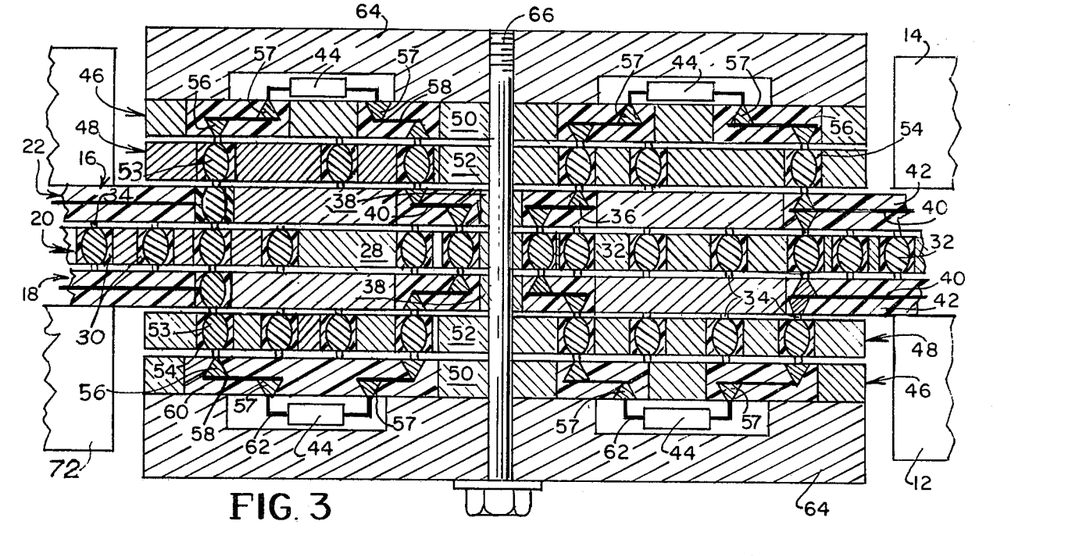
FIG. 3 is a sectional view taken through a portion of the assembly to illustrate the manner in which connections are extended from several pairs of flat packs.

The assembly 10 is formed by a pair of spaced front and rear heat conductive aluminum guide and frame members 12 and 14 respectively, having a stack 16 of wafers 18, 20 and 22 therebetween such as seen in FIGS. 2 and 3. The stack 16 may include one or more interconnect wafers or interconnect wafer screens such as 18 or 22 with a connector wafer or connector wafer screen 20 therebetween and/or additional connector and other screens as is well known in the art and as described in U.S. Pat. Nos. 3,775,844 and 3,769,702, for example.

The number of wafers or screens in the stack 16 is, of course, determined by the circuit requirements and in the particular example illustrated herein, which is only exemplary, the wafer 18 serves as an input/output wafer with external electrical connections thereto and therefrom extended to the stack by means of connector 24. Connector 24 is secured to an extended portion of the rear frame member 14 and is provided with contacts extending to terminals 26 for engaging the contacts of a conventional other connector and a passageway 27 is provided in frame member 14 to facilitate soldering of the connector terminals or contacts. The other interconnect wafer 22 may serve as a voltage plane.

Figures 9, 9A:
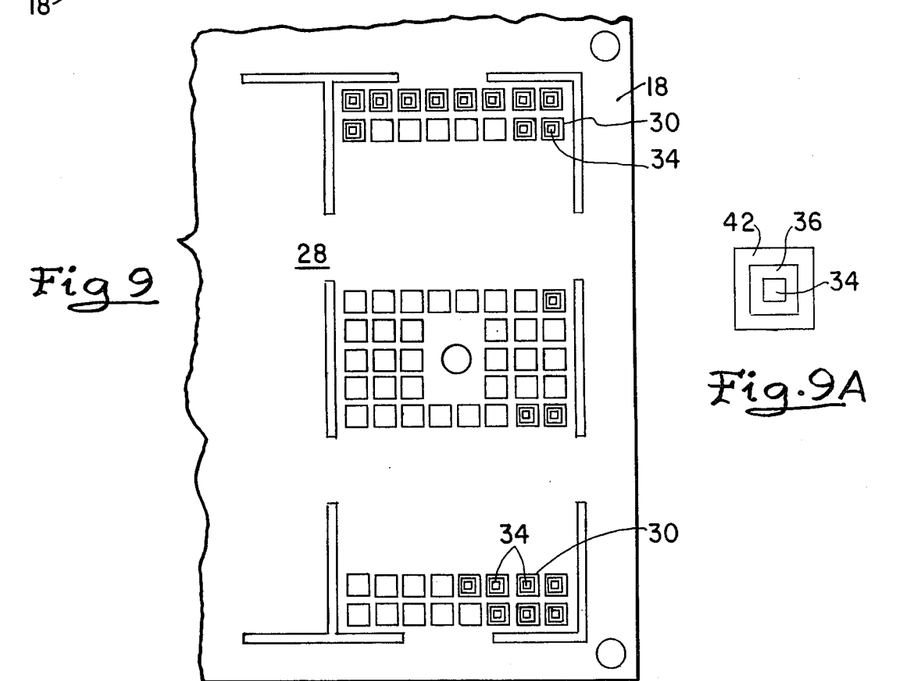
FIG. 9 is a fragmentary elevational view of a connector screen.
FIG. 9A is an enlarged view of a portion thereof, specifically, an enlarged fragmentary view of a connector screen conductive island.

The connector wafer or screen 20 as seen in FIGS. 3 and 9 comprise a conductive generally planar metallic member or sheet 28 substantially 4.5 × 5.25 inches more or less in the X and Y direction and 0.005 × 0.007 inch thick in the Z direction.

A matrix of separate or spaced dielectric areas or inserts such as 30 are provided in the sheet and these in turn encircle and insulate respective metallic slugs or islands such as 32 from the sheet 28. Each slug 32 has a malleable projection or bump 34 substantially 0.005 inch square on opposite ends thereof extending beyond the respective opposite planar surfaces of the wafer 20 for substantially 0.0008 inch and arranged on 50 mil centers, for example. The slugs 32 and bumps 34 form a closely spaced matrix for interconnecting respective similarly spaced and sized conductive islands 36 formed at selected positions on one adjacent surface of wafers 18 and 22 to thus provide connections along a so-called Z axis extending through stack 16 and perpendicularly to the general X and Y plane of the wafers 18, 20 and 22.

The interconnect wafers 16 and 18 or interconnect screen 20 as seen in FIGS. 3, 7, 8 and 9 are substantially the same dimensions. The wafers 16 and 18 are formed similarly from a respective metallic generally planar member or sheet 38 which may be a composite of several sheets and are electrically interconnected by the sheet 28 with the projections 34 formed on sheet 28.

Each sheet 38 is substantially the same thickness as sheet 28 and has conductive islands, slugs or mesas 36 coplanar with the wafer surface. Slugs 36 are interconnected in an X and/or Y direction with respective other slugs or islands 36 by respective conductive segments 40, for example. The islands 36 and the conductive segments 40 are insulated from the respective metallic sheet 38 of the respective wafers 18 or 22 by respective insulating or dielectric portions 42 with the segments 40 buried in the portion 42 so as not to appear at the wafer surface. The islands 36 may extend to opposite surfaces of the wafers or to only one surface, as desired, and together with segments 40 serve to extend electrical connections to or from any particular Z axis formed by slugs 32 laterally along the X and Y axis of the stack 16 and in the general plane of the respective wafer or if desired, directly through the wafer along the Z axis. Islands 36 which are interconnected by a respective segment 40 may, of course, be considered as one island. This arrangement permits electrical connections to extend in accordance with any desired electrical configuration for interconnecting active circuit elements such as represented by flat packs 44 with each other and/or with the terminals of the connector.

It will be understood that the connections illustrated in any of the figures do not represent actual or complete circuit configurations but are merely illustrative of the manner in which connections are extended through the stack 16 and between the components and/or connector.

Figures 4, 4A, 5, 5A:
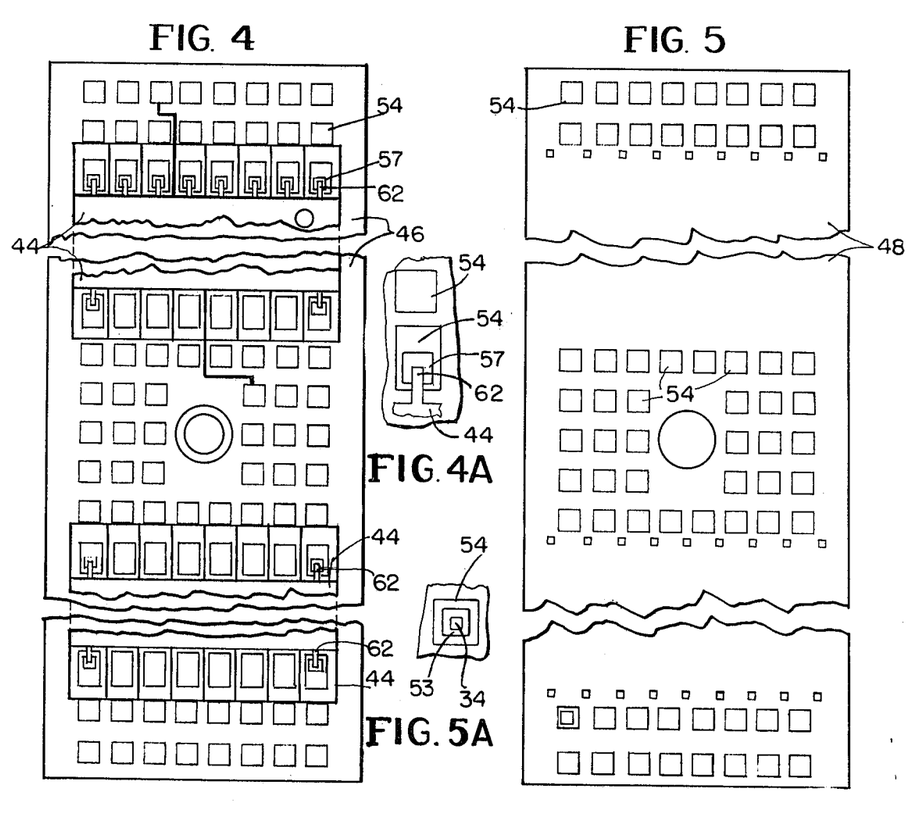
FIG. 4 is a top elevational view of a component wafer and a pair of flat packs.
FIG. 4A is an enlarged view of a portion thereof, specifically, an enlarged view of an end of a component wafer island.
FIG. 5 is an elevational view of a connector screen wafer.
FIG. 5A is an enlarged view of a portion thereof, specifically, an enlarged fragmentary view of a connector screen conductive island.

A component wafer 46 seen in FIGS. 2, 3 and 4 and a connector wafer or connector screen 48 formed from a respective generally planar metallic sheet 50 and 52 respectively is provided for each pair of flat packs 44.

The connector screen 48 is formed similarly to screen 20 and includes dielectric inserts 54 for insulating slugs 53 which have associated projections 34 for interconnecting the conductive islands 36 of wafers 18 or 22 respectively, with the conductive islands 56 of a respective component wafer 46. The component wafers 46 are formed similarly to the wafers 18 and 22 in that conductive islands 57 offset in the X and Y direction and appearing at selected surface portions of each wafer are selectively interconnected by conductive segments 58 and insulated by dielectric portions 60. The islands 56 are, where desired, displaced laterally or sideways along the X and/or Y axis from one surface of the wafer 46 to the other surface to establish a circuit connection from a connector screen slug 53, to a respective lead or terminal 62 of the respective flat pack 44 at the opposite surface of wafer 46. The terminals 62 are soldered, welded or by other means, attached to the surface of respective islands 57 at the adjacent surface of wafer 46 and if the device is a flat pack 44, the small slug of solder between the island 57 and the flat pack lead terminals establishes the connection.

Each pair of flat packs 44 together with a respective component wafer 46 and screen wafer 48 is detachably secured to opposite stack surfaces by means of respective coupon pressure caps 64 and bolts or screws 66 and as may be seen from FIGS. 1 and 1a, 21 pairs more or less of flat packs arranged in three rows of seven may be secured to each stack surface. Thus, with the flat packs less leads being in the neighborhood of 4 inches square, the area of the stack surface occupied by each pair of flat packs associated wafers and pressure cap is in the neighborhood of only 0.65 square inch.

Figures 7, 8:
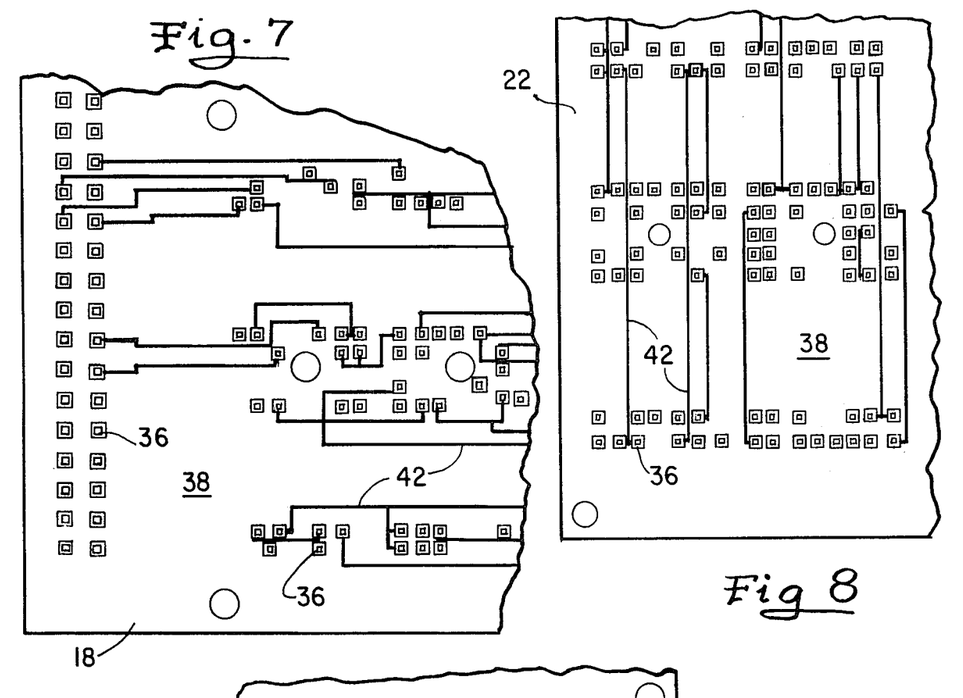
FIG. 7 is a fragmentary elevational view of an interconnect wafer used also as an input/output wafer.
FIG. 8 is a fragmentary elevational view of another interconnect wafer.

The connector mounting frames 12 and 14 comprise rectangularly arranged peripheral walls 68 and 70 respectively engaging the outermost or peripheral portions of the wafers 18 and 22 respectively with portions of walls 70 recessed to guide or locate the stack in the frame member. The walls 68 and 70 together with interconnected struts 72 and pressure caps 64 serve to secure the wafers 18, 20 and 22 of the stack 16 together by means of appropriate fasteners under the desired degree of pressure which will generally be in the neighborhood of 1 to 2 pounds per slug to plastically deform the projections 34 against an opposed surface to ensure good electrical connections. The walls 68 and 70 together with interconnecting struts 72 from access passageways for receiving the wafers 46 and 48 together with the appropriate flat packs 44 and pressure caps 64. The terminals such as 26 of connector 24 are connected to respective conductive segments or mesas 36 in a group arranged in spaced rows adjacent one end or edge of wafer 18 as seen in FIG. 7 by means of solder, welding or other suitable means and the connector is secured to one of the frame members 14 to support the same adjacent one edge of the stack.

As previously mentioned, the terminals or leads 62 of each pair of flat packs 44 are soldered to one surface or end of appropriate conductive segments or islands 57 of the associated component wafer 46. A respective connector screen 48 is located with the projections 34 on both surfaces or end of respective slugs 53 engaged with the adjacent planar surfaces or end of respective correspondingly spaced islands 56 in wafers 46 and 18 or 46 and 22 at opposed surface portions of the stack. A component wafer 46 carrying a pair of flat packs is then located with the surface of each slug engaged with the adjacent projection 34 of a respective island 53 of connector screen 48 at the desired position relative to the stack. As indicated previously, each sheet 20 has a matrix of projections at opposite surfaces to ensure electrical connections to adjacent sheets 18 and 22 and for distributing the load.

A coupon pressure cap 64 guided by the frame walls and struts or guide pins is then engaged with each component wafer 46. The cap 64 comprises a back wall 76 (FIG. 1) from which a pair of spaced side legs or walls 78 together with an intermediate leg or wall 80 extend. The legs 78 and 80 define spaced recesses 82 between the intermediate leg 80 and the respective side legs 78 for receiving a respective flat pack 44 when the cap 64 is placed over a respective pair of flat packs with the back wall 76 overlappingly spaced from the flat packs and legs 78 and 80 engaging the associated component wafer 46.

A respective bolt or screw 66 extends through a passageway in the back wall 76 and intermediate leg 80 of each pressure cap 64 on one side of the stack 16 and through an aligned passageway or opening formed in the metallic sheets of each of the associated wafers 46 and 48, the stack wafers 18, 20 and 22 and in the wafers 46 and 48 at the opposite surface portion of the stack for threaded engagement in a pressure cap 64 adjacent the opposed portion of the stack. On tightening of each screw 66, the islands of the component wafers 46 are held under the desired degree of pressure against the projections on their connector screen wafers 48 to bear against the stack wafers 18, 20 and 22 with the desired pressure. It will be noted that the circuit connections from the components extending through the stack underlie appropriate pressure cap legs to ensure that sufficient pressure is applied to the connections, while the legs straddle the components to avoid pressure thereon. To prevent pressure cap deformation, it is preferable to form the pressure cap 64 for proper material such as aluminum to provide an even pressure field on the faces of legs 78 and 80. The bolts or screw 66 may, of course, be easily removed if the same should be found necessary for either replacing or removing certain of the flat packs and associated wafers for testing and repair.

Figure 6:
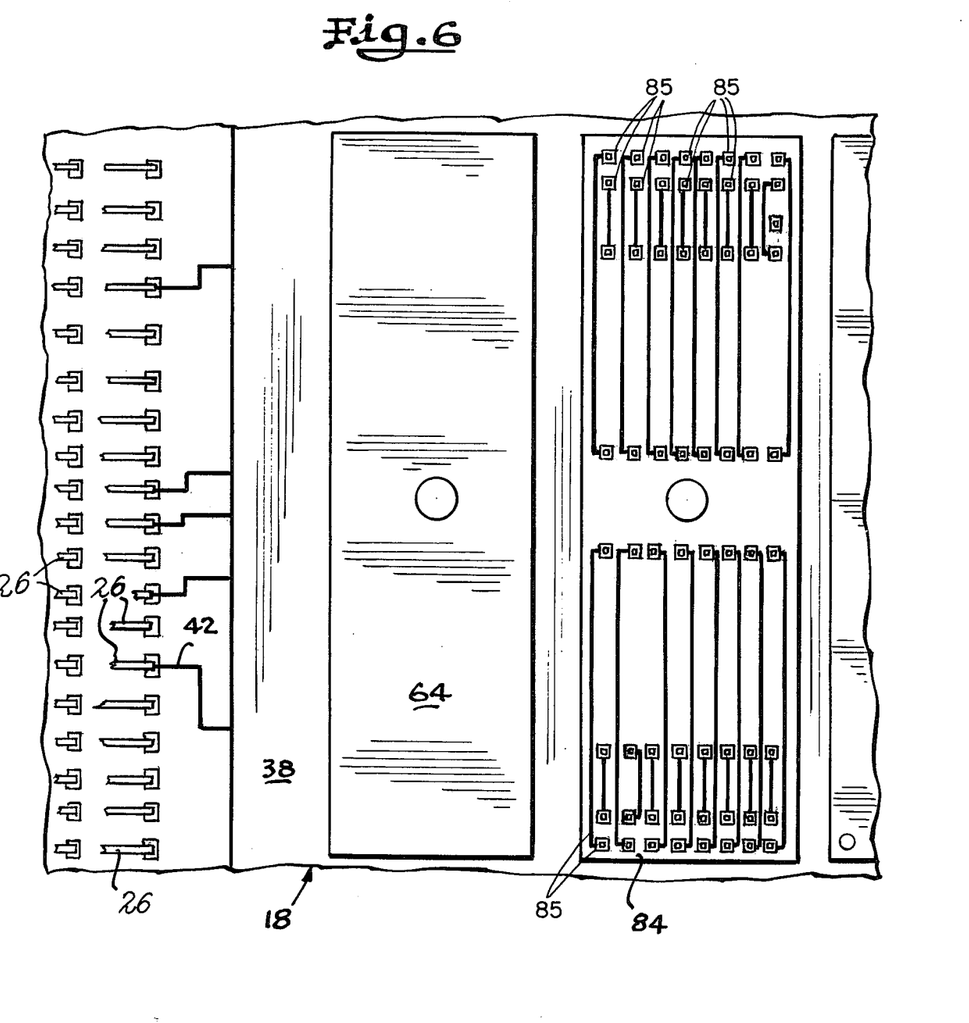
FIG. 6 is a fragmentary elevational view of a portion of the stack with one of the pressure caps and component wafers removed.

Thus in FIG. 6, wafer 84 is seen having a test circuit configuration. Wafer 84, if left in the assembly under component wafer 46, permits tests to be performed on the components of its contacting component wafer by providing probe points 85.

Figure 10:
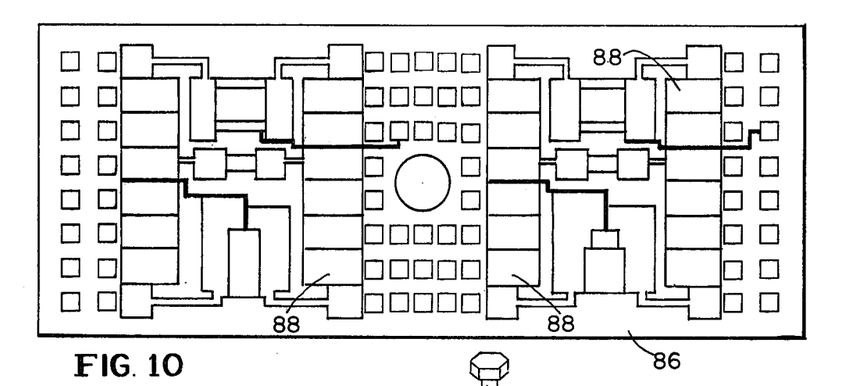
FIG. 10 is an elevational view of the component wafer carrying chip resistors.

The flat packs 44 may be omitted and a component wafer 86, as seen in FIG. 10, may be used. In this case, the component wafer 86 has attached to the conductive segments or means thereof chip resistors 88 and/or other active circuit components for performing certain circuit functions.

Figure 11:
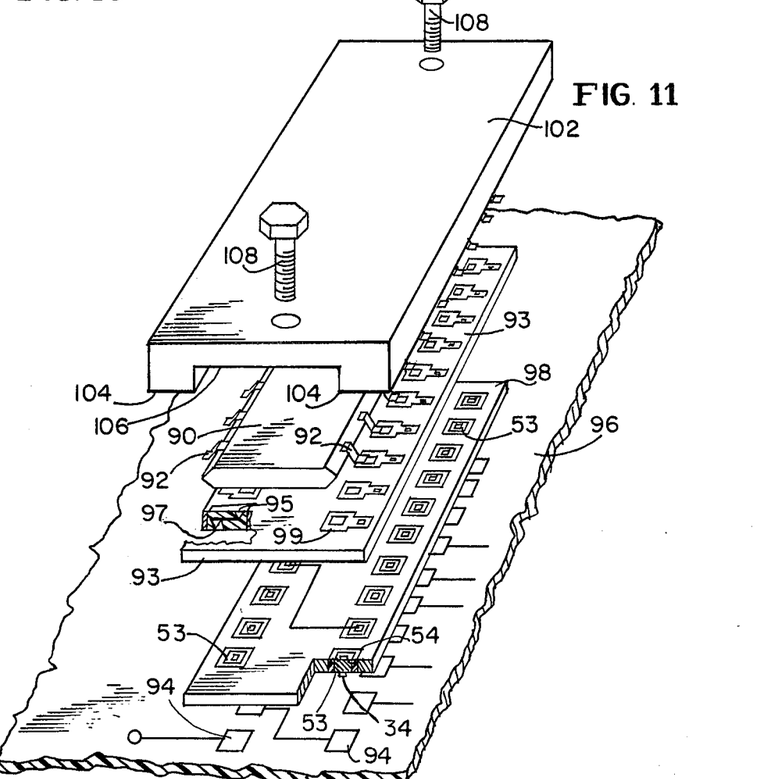
FIG. 11 is an exploded isometric view of an assembly for mounting a dual in-line pin package on a wafer or a printed circuit card.

In FIG. 11, another arrangement for detachably securing active circuit components to a wafer is shown. A connector screen wafer 98 having conductive islands or Z axis slugs 53 which have projections on both sides 34, provide interconnection of component wafer 93 with wafer 96. The dual in-line package terminals 92 are soldered to the component wafer islands 95, these being connected to islands 97 which are connected by means of connector screen 98 to islands 94 on the wafer 96. The islands 94 and 97 present a planar surface and therefore ensure connection to each other by means of the connector screen 93 and its malleable projections 34.

To secure and pressurize the wafers 93 and 98 to the board 96, a pressure cap 102 is provided with spaced legs 104 to define a recess 106 for receiving the package 90. The legs 104 engage the wafer 98 with the board 96 under pressure of screws 108, which pass through appropriately spaced openings or passageways in the wafer 98 and the printed circuit board 96. If desirable, the screws may extend through a similar arrangement of another wafer, package and cap on the opposite side of the board 96 for threaded engagement in the other cap to secure the wafers and packages to the board with the projections on slugs 53 engaging the adjacent planar surface of segments 94 under the desired degree of pressure. This arrangement permits facile detachment of the package 90 for repair or replacement without thereafter unsoldering or soldering the leads or parts. Multiple dual in-line packages or DIP assemblies of various types can be mounted in the described manner as well as hybrid circuit assemblies.

The board 96 may be a interconnection wafer having coaxial characteristics or a conventional printed circuit board, either technology benefitting by the ability to easily disconnect components from the wiring system.

What is claimed is:

1. A circuit module comprising:
    a stack of substantially metallic wafers, each having islands of conductive material each encircled by a solid dielectric material with one end of each island connected to a respective island of another wafer by a malleable metal portion for extending a respective electrical connection in a Z-axis direction through said stack and one surface of each wafer connected to one surface of an adjacent wafer of the stack by a respective malleable metal portion to extend a common connection through said stack and each end wafer of said stack providing an external surface for said stack with the islands of each end wafer terminating adjacent the respective external surface;
    a metal frame member engaging the external surface of each end wafer and including means for clamping said wafers and each frame member under pressure to place said wafers and frame members in close heat transmitting relationship through the malleable metal portions with each frame member having a passageway enabling access to a portion of each external surface and the conductive islands of each end wafer;
    a plurality of substantially metallic component wafers each located in a respective passageway and having conductive islands with each component wafer conductive island encircled by a solid dielectric and extending toward opposite surfaces of the respective component wafer;
    a like plurality of substantially metallic connector wafers, each interposed between a corresponding component wafer and an accessible external surface portion of said stack with each connector wafer having conductive slugs, each connector wafer slug encircled by a solid dielectric and spaced in registry with a respective component wafer conductive island and a respective conductive island terminating adjacent the external surface of a respective end wafer for extending a respective connection in a Z axis direction to and from the connected islands of said stack with separate conductive malleable means located between one end of each component wafer conductive island and each slug at one surface of said connector wafer and between the other surface of said connector wafer and the accessible external surface portion of each end wafer;

a plurality of active circuit components each having terminals connected to the other end of selected ones of said component wafer islands;

detachable securing means including a metal pressure cap received in each passageway and an elongate metal member extending into said stack and through a respective component wafer and respective connector wafer in the respective passageway with each cap in close heat transmitting relationship to one frame member and in overlapping heat transmitting engagement with one surface of a respective component wafer for applying pressure through the respective component wafer and the respective connector wafer and through the separate malleable means and conductive slugs to said stack for extending respective electrical connections between said terminals and respective islands of said stack and to provide a common connection between said stack and component wafer while detachably securing the respective component and connector wafers in close heat transmitting relationsip to the cap and stack, one wafer in said stack having a group of conductive islands adjacent one edge thereof, each island in said group of islands connected to a respective other island of said one wafer; and a connector supported by one frame member in heat transmitting relationship and having a terminal connected to each island of said group for extending external electrical connections to and from said stack.

2. The circuit module as recited in claim 1, in which said means clamping each frame member includes means detachably securing each frame member to said stack with said frame members engaging peripheral portions of the respective end wafers.

3. The circuit module claimed in claim 1, in which said one edge of said one wafer is located beyond the corresponding edge of each other wafer of said stack and said one wafer is an end wafer of said stack and forms a first interconnect wafer and the other end wafer of said stack is a second interconnect wafer, and a third wafer in said stack is a connector screen located between said first interconnect wafer and said second interconnect wafer.

4. The circuit module claimed in claim 1, in which a pressure cap is located adjacent opposite ends of said elongate member.

* * * * *